US012799599B2

(12) United States Patent
Huang et al.

(10) Patent No.: US 12,799,599 B2
(45) Date of Patent: Nov. 17, 2026

(54) SYSTEMS AND METHODS FOR MONITORING A CONDITION OF LAMPS USED IN SEMICONDUCTOR FABRICATION PROCESSING

(71) Applicant: ASM IP Holding B.V., Almere (NL)

(72) Inventors: Shujin Huang, Phoenix, AZ (US); Peter Bryan Ruckle, Tucson, AZ (US); Junwei Su, Chandler, AZ (US); Daw Gen Lim, Tempe, AZ (US)

(73) Assignee: ASM IP Holding B.V., Almere (NL)

( * ) Notice: Subject to any disclaimer, the term of this patent is extended or adjusted under 35 U.S.C. 154(b) by 408 days.

(21) Appl. No.: 18/476,009

(22) Filed: Sep. 27, 2023

(65) Prior Publication Data

US 2024/0110283 A1 Apr. 4, 2024

Related U.S. Application Data

(60) Provisional application No. 63/411,842, filed on Sep. 30, 2022.

(51) Int. Cl.
*C23C 16/48* (2006.01)
*H10P 74/20* (2026.01)

(52) U.S. Cl.
CPC .......... *C23C 16/482* (2013.01); *C23C 16/481* (2013.01); *H10P 74/207* (2026.01)

(58) Field of Classification Search
CPC .... C23C 16/482; C23C 16/481; H10P 74/207
See application file for complete search history.

(56) References Cited

U.S. PATENT DOCUMENTS

| | | | | |
|---|---|---|---|---|
| 5,576,695 A * | 11/1996 | Minger | .................. | H10P 74/23 340/649 |
| 6,268,270 B1 | 7/2001 | Scheid | | |
| 6,324,434 B2 | 11/2001 | Coe | | |
| 6,577,926 B1 | 6/2003 | Chang | | |
| 6,775,471 B2 | 8/2004 | Blersch | | |
| 7,398,683 B2 | 7/2008 | Lehtonen | | |
| 8,457,479 B2 | 6/2013 | Kubo | | |

(Continued)

FOREIGN PATENT DOCUMENTS

| | | |
|---|---|---|
| JP | 2000223434 A | 8/2000 |
| JP | 2002151426 A | 5/2002 |

(Continued)

*Primary Examiner* — Peter M Albrecht
(74) *Attorney, Agent, or Firm* — Banner & Witcoff, Ltd.

(57) ABSTRACT

Methods and systems for monitoring a heat lamp system are disclosed. An exemplary method includes installing a new heat lamp within a reactor system, measuring an initial resistance value of the heat lamp, recording, by a controller, the initial resistance value of the heat lamp, determining a subsequent resistance value of the heat lamp, comparing the subsequent resistance value to the initial resistance value, determining whether the subsequent resistance value deviates from the initial resistance value by a programmed threshold value or more and/or falls below a programmed threshold voltage, and providing a user output to a user interface if the subsequent resistance value deviates from the initial resistance value by the programmed threshold value and/or falls below the programmed threshold voltage. An exemplary system can perform the method of monitoring the heat lamp system.

18 Claims, 8 Drawing Sheets

(56) References Cited

U.S. PATENT DOCUMENTS

| | | | | |
|---|---|---|---|---|
| 2013/0130184 A1* | 5/2013 | Lu | F27D 21/00 | 432/1 |
| 2014/0067324 A1* | 3/2014 | Ho | G05B 19/4065 | 702/183 |

FOREIGN PATENT DOCUMENTS

| | | | |
|---|---|---|---|
| JP | 2008288480 | A | 11/2008 |
| KR | 200293802 | Y1 | 11/2002 |

* cited by examiner

SYSTEMS AND METHODS FOR MONITORING A CONDITION OF LAMPS USED IN SEMICONDUCTOR FABRICATION PROCESSING

CROSS-REFERENCE TO RELATED APPLICATION(S)

This application claims the benefit of U.S. Provisional Application 63/411,842 filed on Sep. 30, 2022, the entire contents of which are incorporated herein by reference.

FIELD OF INVENTION

The disclosure generally relates to systems that include lamps used in semiconductor fabrication processing and to methods of using such systems. More specifically the disclosure relates to systems and methods to monitor the condition or remaining service life of such lamps.

BACKGROUND OF THE DISCLOSURE

The use of one or more lamps in semiconductor fabrication processing is known and in an example such lamps may be positioned adjacent and external to a reactor chamber used for semiconductor fabrication. Such lamps can be used to provide heat in the form of infrared (IR) energy into a chamber of the reactor containing a substrate during one or more stages of the semiconductor fabrication process to, for example, maintain a desired deposition temperature therein when a precursor is introduced in the reactor chamber and across the substrate. As such lamps are reused over and over again in subsequent semiconductor fabrication processes, the efficiency or service life of the lamps degrade and/or the lamps fail over time and need to be replaced.

It is known to replace such lamps after the passage of a predetermined amount of time has passed, e.g., a predetermined amount of time after the lamp when new was installed, or after a lamp failure. However, this approach of cyclic lamp replacement based on such predetermined time or lamp failure may lead to prolonged use of lamps that are no longer effective or reliable and/or may result in the unnecessary replacement of lamps that are still efficient and reliable. This occurs because each lamp can have an individualized power ratio applied to it, such that some lamps in the system may have more power applied to them over the same amount of time. Accordingly, it is desired that a system and method for monitoring such lamps to facilitate lamp replacement based on actual lamp efficiency and service condition to thereby avoid the extended use of inefficient or unreliable lamps and/or the early replacement of still efficient and reliable lamps.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY

Example systems as disclosed herein are configured to determine a condition or health of a lamp used in semiconductor fabrication processing. In an example, semiconductor fabrication processing makes use of a reactor comprising a reaction chamber. A substrate support or susceptor is disposed within the reaction chamber, and a lamp is disposed outside of the reaction chamber and optically coupled to the susceptor via a wall of the chamber. In an example, the lamp may be any lamp used for the semiconductor fabrication process. In an example, the lamp is a heat lamp that provides radiant energy or heat inside of the chamber.

Systems and methods described herein may suitably use a plurality of such lamps about an exterior of the reaction chamber. An exemplary system comprises a controller that is configured or programmed to determine an initial resistance value of the heat lamp once placed into use in the semiconductor fabrication process. In an example, the controller is configured or programmed to compare the determined subsequent resistance value of the heat lamp to a programmed threshold value and provide an indication when the determined subsequent resistance value falls below the programmed threshold value. The programmed threshold value can be, for example, a percentage of the initial resistance value or a set resistance value. In an example, the indication may be provided to a user interface device. In an example, the programmed threshold value reflects a condition of the heat lamp that is at or near the end of its effective service life such that the indication may be used to schedule replacement of the heat lamp. In an example, the programmed threshold value may be a determined resistance level of the lamp or may be a determined resistance difference as measured from an initial resistance value of the lamp when new. In an example, the programmed threshold value is between about 8 ohms and about 12 ohms or approximately 10 ohms, and the controller provides an indication when the determined subsequent resistance value of the heat lamp is below the programmed threshold value. In accordance with examples of the disclosure, the programmed threshold value can indicate a remaining heat lamp service life of approximately 20 percent, and the initial resistance value equates to a service life of approximately 100 percent.

In an example, the system comprises a sensor that is in electrical connection with the heat lamp and that is configured to determine an electrical current flow to the lamp during use. In an example, the controller is configured or programmed to determine the subsequent resistance value of the heat lamp from the electrical current flow as provided by the sensor and the amount of electrical power used to power the heat lamp. In an example, the controller is configured or programmed to determine the subsequent resistance value of the heat lamp after repeated uses of the heat lamp during subsequent semiconductor fabrication process uses. In an example, the controller is configured or programmed to determine the subsequent resistance value of the lamp or heat lamp during a predetermined stage or operating condition of the semiconductor fabrication process. In an example, the system is configured to determine the individual condition of more than one heat lamp, and the controller is configured or programmed to independently determine a subsequent resistance value of each individual heat lamp and provide an indication when the determined subsequent resistance value of each individual heat lamp has fallen below the programmed threshold value provided for each respective individual heat lamp. In some cases, the system and method can be tuned to indicate to a user when the subsequent resistance value goes above a programmed threshold value.

In an example, a method of monitoring the condition of a heat lamp using the example system disclosed above is performed by determining the subsequent resistance value of the heat lamp after being used in the semiconductor fabrication process and comparing the subsequent resistance value to the programmed threshold value. If the subsequent resistance value of the heat lamp has fallen below the programmed threshold value, then an indication is provided for the purpose of taking steps to replace the heat lamp as the condition of such heat lamp is at or near the end of its effective service life. The method can be used on both reduced pressure and atmospheric chambers, the method being particularly advantageous on atmospheric chambers employed for high temperature, thick material layer deposition methods due to the relatively high power applied to the heat lamps for extended periods of time Such example systems and methods disclosed herein enable independent monitoring of a condition of one or more heat lamps during use in subsequent semiconductor fabrication processes and provide a more reliable approach to replacing heat lamps having a condition determined to be approaching the end of their determined effective service life. Additionally or alternatively, exemplary methods and systems disclosed herein allow continued use of heat lamps that are still within their determined effective service life, as contrasted to the present approach based on time, which may result in replacing efficient and reliable heat lamps and/or continuing to use inefficient and unreliable heat lamps.

BRIEF DESCRIPTION OF THE DRAWINGS

A more complete understanding of exemplary embodiments of the present disclosure can be derived by referring to the detailed description and claims when considered in connection with the following illustrative figures.

DETAILED DESCRIPTION

Semiconductor fabrication lamp monitoring systems and methods as disclosed herein are generally configured to monitor or measure a condition of one or more lamps as they are used during subsequent semiconductor fabrication processes, and provide an indication when a monitored or measured condition of a lamp falls below a programmed threshold value that indicates that lamp is close to or at an end of its effective service life, so the lamp can be suitably replaced. In an example, systems and methods as disclosed herein rely on monitoring and measuring a resistance of the lamp both when the lamp is new (e.g., by taking an initial or reference resistance measurement) and as the lamp is used for the purpose of determining the lamp's condition for purposes of continuing to use the lamp until such time as the lamp performance is determined to fall below the programmed threshold value, at which time the lamp is identified for replacement. In an example, the system is configured to monitor and keep a record of the performance of each individual lamp of a plurality of lamps (e.g., all lamps) to thereby facilitate the replacement of only those lamps identified as performing close to the end of effective service life, while enabling the continued use of lamps that are still performing within effective service life.

While in this description the systems or methods disclosed herein may be described for use with heat lamps used during semiconductor fabrication, it is to be understood that systems and methods disclosed herein for monitoring a health of lamps may be used with heat lamps or any other types of lamps that may be used in the semiconductor fabrication process.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or other derived representative value. Further, in this disclosure, the terms "include," "including," "constituted by" and "having" can refer independently to "typically or broadly comprising," "comprising," "consisting essentially of," or "consisting of" in some embodiments. In this disclosure, any defined meanings do not necessarily exclude ordinary and customary meanings in some embodiments.

Figure 1:
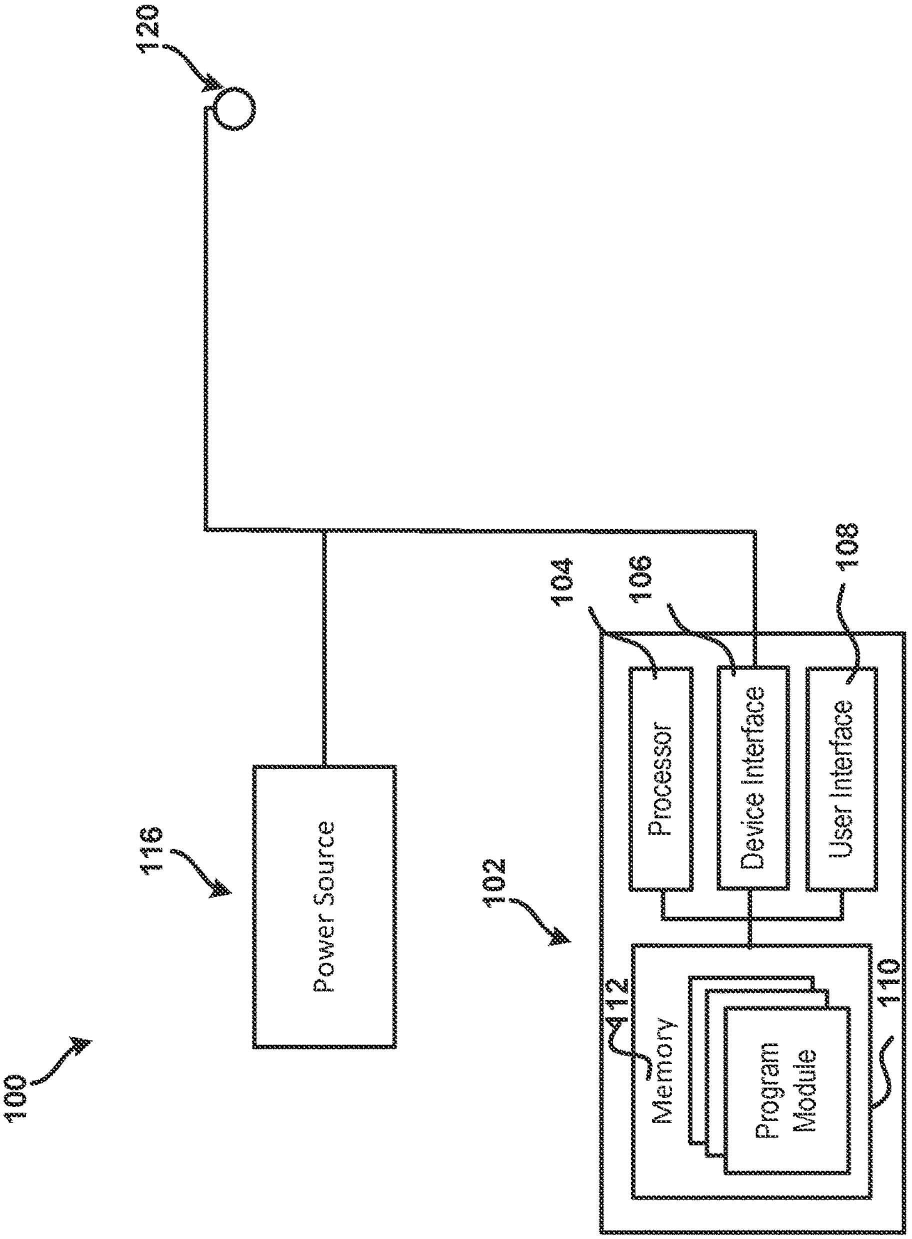
FIG. 1 is a schematic diagram of a heat lamp system in accordance with exemplary embodiments of the disclosure.

FIG. 1 illustrates an exemplary heat lamp system 100 suitable for use in a reactor system. Heat lamp system 100 includes a heat lamp 120 and a controller 102. Heat lamp 120 can include any suitable heat lamp, for example, an infrared heating lamp. Heat lamp 120 may be a linear lamp. Heat lamp 120 may be a spot-type lamp. The heat lamp system 100 may include linear lamps, spot lamps, or both linear lamps and spot lamps. Controller 102 can be configured to provide independent control to the heat lamp 120. An electrical power source 116 can be in electronic communication with the heat lamp 120, and the electrical power source 116 is configured to send power to the heat lamp 120. The electrical power source 116 is also in electronic communication with the controller 102. By way of example, controller 102 can be configured to generate signals (e.g., power ratio output) for independently controlling heat lamp 120 based on sensed temperatures. Exemplary methods of generating the control signals are described below.

In the illustrated example, controller 102 includes a processor 104 that manages memory 112 of the controller 102 (or accessible by controller 102), and program module 110 that can include software or executable instructions or code that may be executed by processor 104 to provide temperature monitoring and control functions described herein. Controller 102 can further include a user interface 108 for facilitating an operator selecting between control or program module 110, interacting with monitored temperature data, modifying, or updating deposition or processing parameters, and the like. User interface 108 can include a graphical user interface (GUI) generated by the processor 104 that may be displayed on a monitor, touchscreen, or the like. The GUI can be used to, for example, input setpoints as described herein. A device interface 106 may be provided as part of controller 102 with one or more input/output (I/O)

components to facilitate wired or wireless communications between controller 102 and heat lamp 120.

Figure 2:
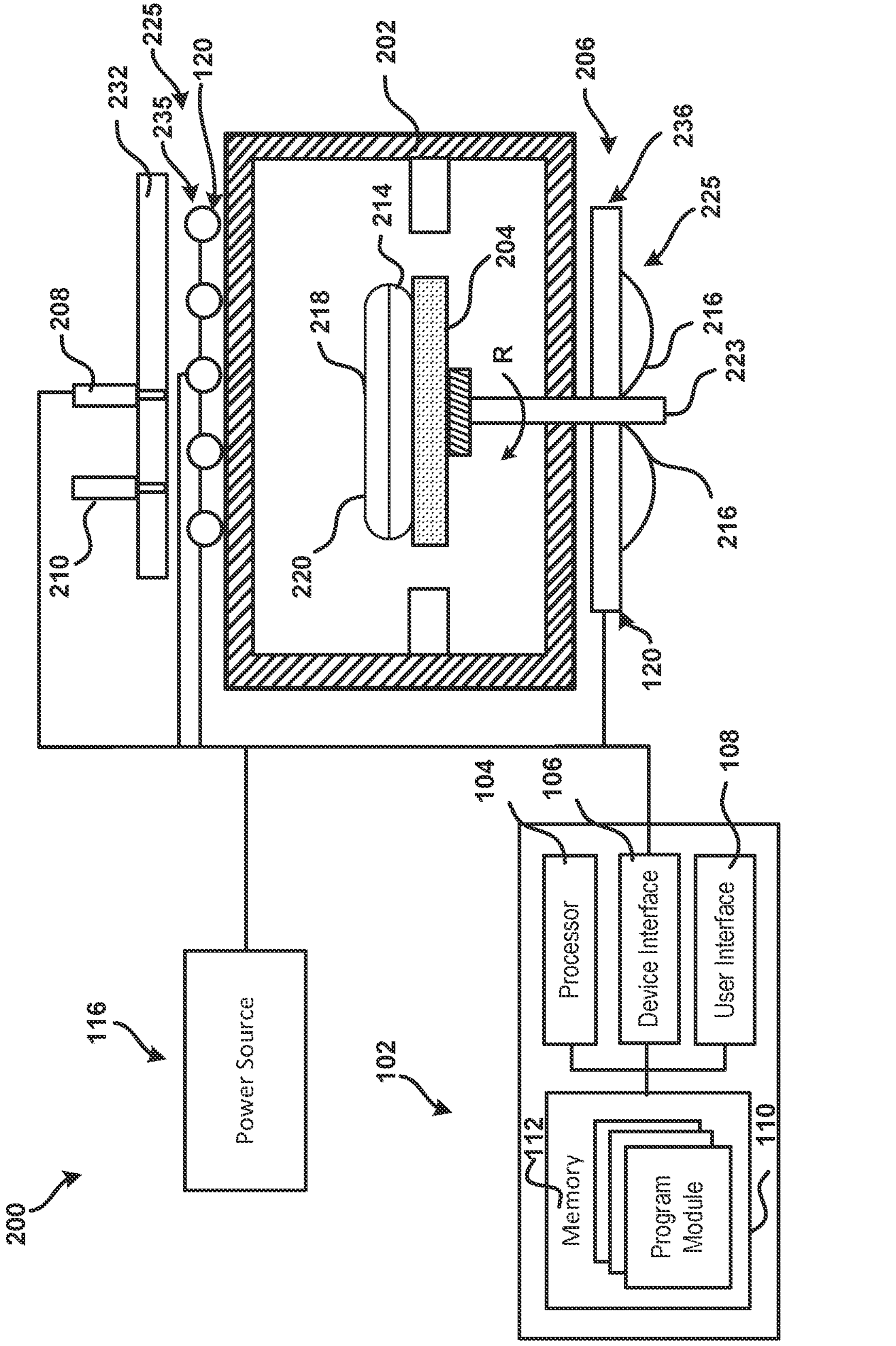
FIG. 2 is a cross-sectional view of a reactor system in accordance with additional exemplary embodiments of the disclosure.

FIG. 2 illustrates an exemplary reactor system 200 suitable for chemical vapor deposition (CVD) as used with semiconductor fabrication. Reactor system 200 includes a reaction chamber 202, a substrate support or susceptor 204, a heat lamp array 225 with one or more heat lamps 120, a first pyrometer 208, a second pyrometer 210, and the controller 102. Reactor system 200 can also include a reflector or reflective surface 232, wherein at least a portion of heat lamp array 225 is between reflective surface 232 and reaction chamber 202. The reactor system 200 can be an epitaxial reactor system which utilizes atmospheric pressure (e.g., between about 500 torr and about 760 torr) or reduced pressure (e.g., between about 3 torr and about 500 torr) during deposition. The controller 102 can be as described above and can be configured to individually control the power ratio output from the electrical power source 116 to each heat lamp 120 of the heat lamp array 225.

As discussed in more detail below, heat lamp array 225 can include one or more heat lamps aligned in a first direction and one or more heat lamps aligned in a second (e.g., substantially perpendicular—e.g., 85-95 degrees offset from the first direction) direction. For example, heat lamp array 225 can include a first portion of heat lamps 235 aligned in a first direction and a second portion of heat lamps 236 aligned in a second direction. The heat lamps 120 can be or include linear lamps. In addition, heat lamp array 225 can include one or more (e.g., infrared) spot lamps 216. The heat lamp array 225, is supported outside the reaction chamber 202 to provide heat energy in the reaction chamber 202 without appreciable absorption reaction chamber walls.

In an example, the reactor system 200 is used for performing epitaxial deposition of material comprising silicon on a single substrate. In an example, the reactor system 200 is capable of accomplishing multiple deposition steps in the reaction chamber 202. While the reaction chamber 202 has been described for use in depositing material comprising silicon, it is to be understood that the reaction chamber 202 may be used to deposit other materials other than silicon during the semiconductor fabrication process. Also, while the exemplary embodiments are described in the context of a chemical vapor deposition or epitaxial reactor for processing semiconductor wafers, the processing methods described herein have utility in conjunction with other heating and/or cooling systems, such as those employing inductive or resistive heating.

Reaction chamber 202 can be formed of any suitable material, such as ceramic materials including quartz and sapphire, or any other material transparent to radiation emitted from lamps 120, 216. By way of particular example, reaction chamber 202 can be formed of quartz, which transmits electromagnetic radiation emitted by lamps 120, 216, as well as radiation emitted by substrate supported on the substrate support 204 to the pyrometers 208, 210, and from which the pyrometers 208, 210 determine temperature at, for example, a substrate first location 218 and a substrate second location 220 corresponding to the spacing of the pyrometers 208, 210. In certain examples, the reaction chamber 202 may have planar walls, such as a planar upper wall and a planar lower wall. In accordance with certain examples, one or more of the upper wall and the lower wall may have an arcuate or dome-like shape.

Substrate support 204 can be formed of for example, graphite, and may have silicon carbide coating. In some cases, substrate support 204 is formed of material that emits radiation used by pyrometers 208, 210 to measure a temperature of substrate support 204. As illustrated, substrate support 204 can be connected to a rotatable shaft 223 that is configured to cause substrate support 204 to rotate in a direction R.

While FIG. 2 illustrates a single reactor (e.g., a single-wafer, cold-wall, cross-flow reactor) used for semiconductor device fabrication, it is understood that semiconductor fabrication processes may make use of equipment comprising two or more such reactors that are operated to facilitate scaling the fabrication of multiple semiconductors. Accordingly, systems as methods as disclosed herein may be configured to monitor the lamps of a single reactor or the lamps of multiple reactors according to the specific type of semiconductor fabrication equipment being used.

In an example embodiment, the heat lamps 120 are powered by a power source 116 that is independent of powering other elements used during the semiconductor fabrication process and that provides a known amount or level of electrical power, such that each individual heat lamp independently receives a known amount of electrical power. In an example, the heat lamps may each be powered by a respective separate electrical power source or may each be powered by the same electrical power source 116. Whether powered by a same power source 116 or multiple power sources 116, each lamp 120, 216 can receive individualized power based on, for example, direct heat distribution within the reaction chamber or across a substrate. The individualized or independent power can be based on a ratio of total power output of the one or more power sources.

Figure 3:
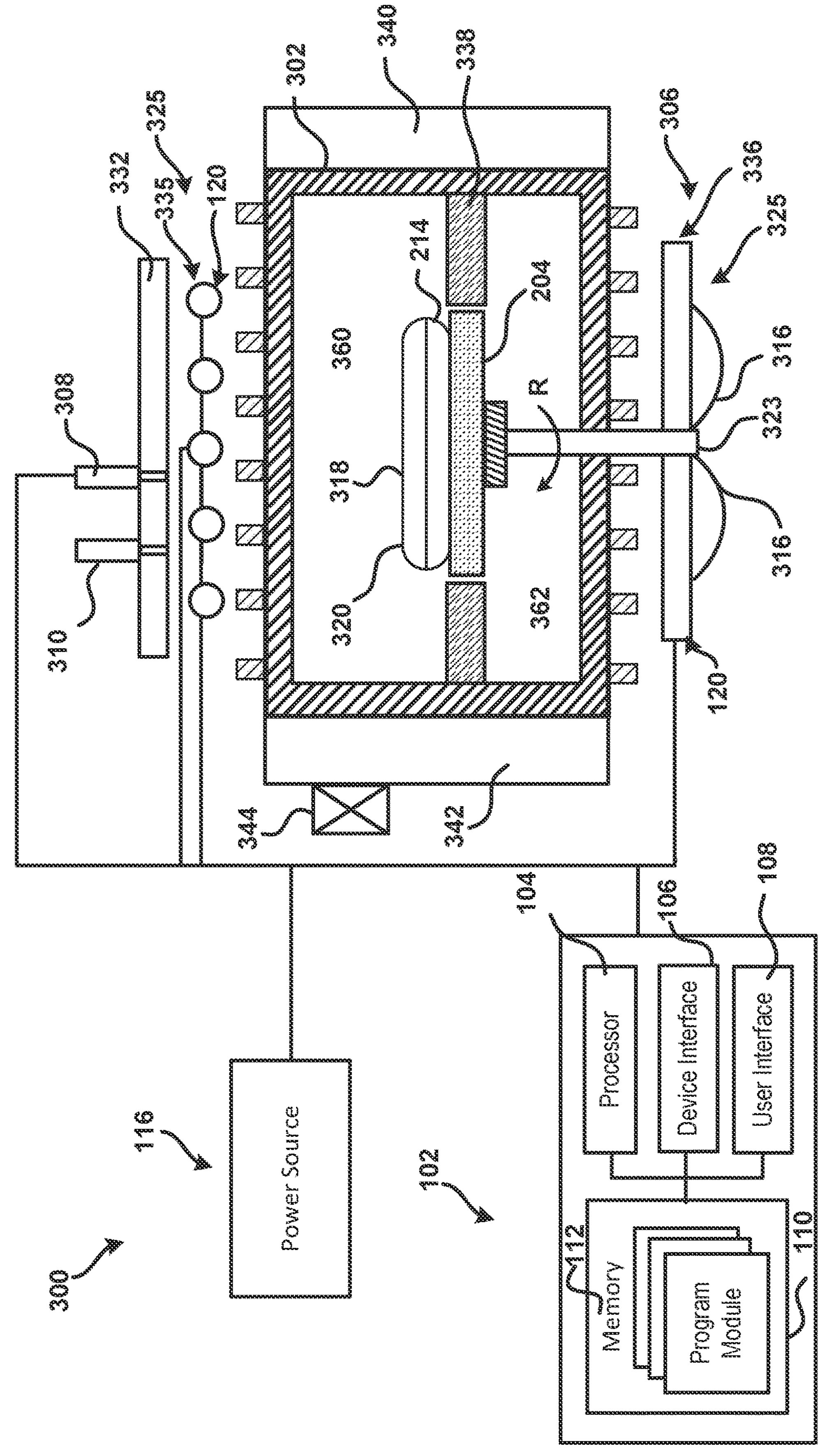
FIG. 3 is a cross-sectional view of a reactor system in accordance with additional exemplary embodiments of the disclosure.

FIG. 3 illustrates another exemplary reactor system 300 suitable for semiconductor fabrication. Reactor system 300 includes a reaction chamber 302, the substrate support or susceptor 204, a heat lamp array 335 with one or more heat lamps 120, a first pyrometer 308, a second pyrometer 310, and the controller 102. Reactor system 300 can also include a reflector or reflective surface 332, wherein at least a portion of heat lamp array 325 is between reflective surface 332 and reaction chamber 302. The reactor system 300 can be, for example, an epitaxial reactor system, which utilizes reduced pressure, for example the pressure in the reaction chamber 302 can be between about 3 torr and about 500 torr during operation. The controller 102 can be as described above and can independently control the power ratio output from the one or more electrical power source(s) 116 to each heat lamp 120 of the heat lamp array 325.

The reactor system 300 also includes a divider 338 disposed within the reaction chamber 302. The divider 338 is used to help separate the top section 360 and bottom section 362 of the reaction chamber 302. An injection flange 342 is disposed at one end of the reactor system 300 and is constructed and arranged to introduce precursors and/or reactants into the reaction chamber 302. A gate valve 344 can be disposed at the same end and can be used to open and close to allow loading and unloading of substrates. An exhaust flange 340 is disposed on the opposite end of the reactor system 300 and the exhaust flange 340 is constructed and arranged to remove exhaust gases from the reaction chamber 302 during or after deposition.

As discussed in more detail below, heat lamp array 325 can include one or more heat lamps aligned in a first direction and one or more heat lamps aligned in a second (e.g., substantially perpendicular—e.g., 85-95 degrees offset from the first direction) direction. For example, heat lamp array 325 can include a first portion of heat lamps 335 aligned in a first direction and a second portion of heat lamps 336 aligned in a second direction. The heat lamps 120 can be or include linear lamps. In addition, heat lamp array 325 can include one or more (e.g., infrared) spot lamps 316. The heat lamp array 325, is supported outside the reaction chamber 302 to provide heat energy in the reaction chamber 302 without appreciable absorption reaction chamber walls.

In an example, the reactor system 300 is used for performing epitaxial deposition of material comprising silicon on a single substrate. In an example, the reactor system 300 is capable of accomplishing multiple deposition steps in the reaction chamber 302. Additionally, or alternatively, reaction chamber 302 may be used to deposit materials other than silicon, and/or etch a surface, and/or clean a surface during the semiconductor fabrication process. The processing methods described herein can also have utility in conjunction with other heating and/or cooling systems, such as those employing inductive or resistive heating.

Reaction chamber 302 can be formed of any suitable material, such as ceramic materials including quartz and sapphire, or any other material transparent to radiation emitted from lamps 120, 316. By way of particular example, reaction chamber 302 can be formed of quartz, which transmits electromagnetic radiation emitted by lamps 120, 316, as well as radiation emitted by substrate supported on the substrate support 204 to the pyrometers 308, 310, and from which the pyrometers 308, 310 determine temperature at, for example, a substrate first location 318 and a substrate second location 320 corresponding to the spacing of the pyrometers 308, 310. Substrate support 204 and other reactor system 300 components 102, 116, 120, and 214 can be as described above in connection with FIG. 2.

While FIG. 3 illustrates a single reactor used for semiconductor fabrication, it is understood that semiconductor fabrication processes may make use of equipment comprising two or more such reactors that are operated to facilitate scaling the fabrication of multiple semiconductors. Accordingly, systems as methods as disclosed herein may be configured to monitor the lamps of a single reactor or the lamps of multiple reactors according to the specific type of semiconductor fabrication equipment being used.

Figure 4:
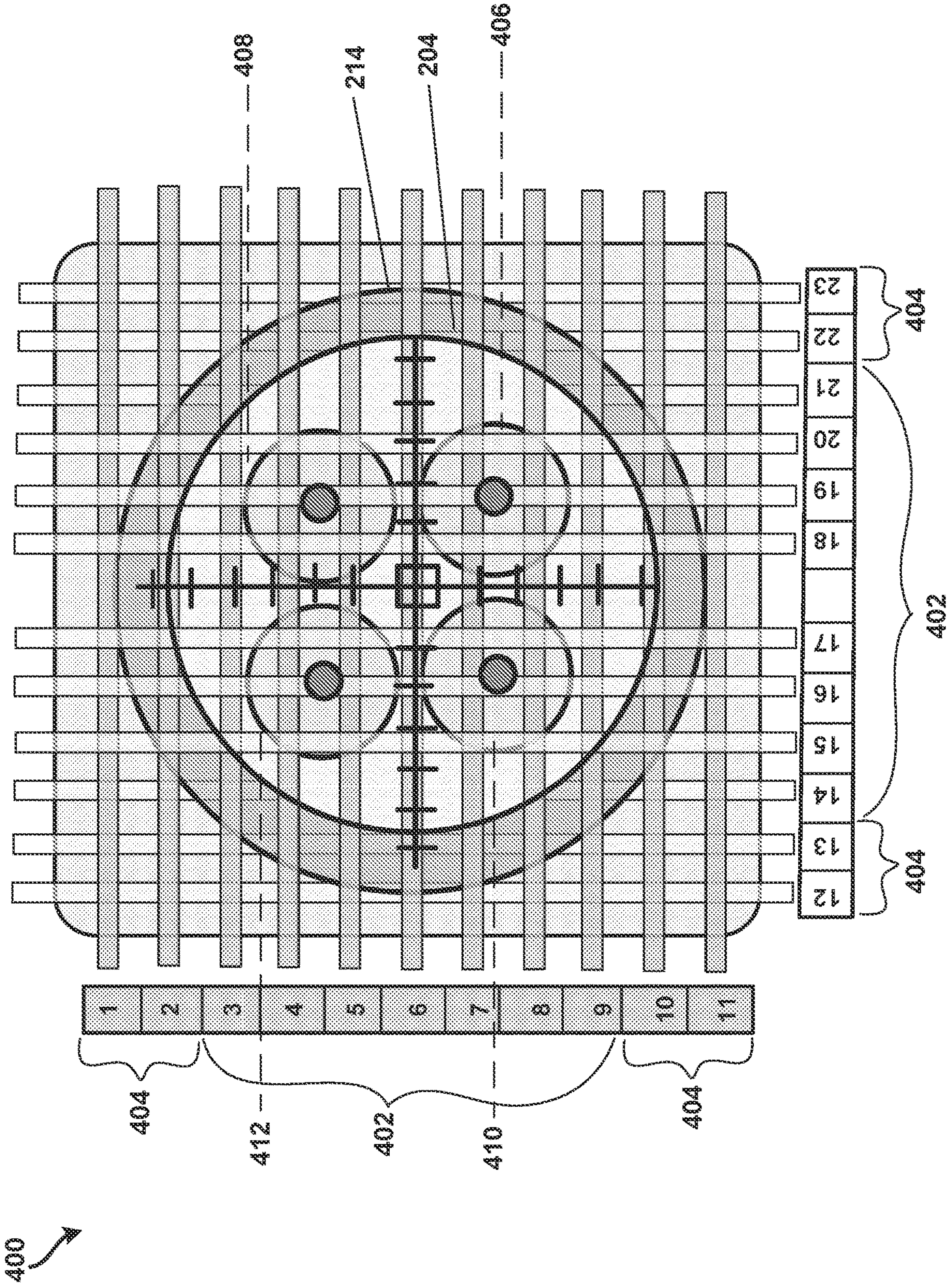
FIG. 4 is a cross-sectional top view of a reactor system in accordance with additional exemplary embodiments of the disclosure.

FIG. 4 illustrates an exemplary heat lamp array 400 suitable for use as heat lamp arrays 225 and 325 in accordance with examples of the disclosure. Heat lamp array 400 includes a first zone of one or more heat lamps 402 and a second zone of one or more heat lamps 404. Exemplary heat lamp arrays can suitably include more than two zones of heat lamps. For example, exemplary heat lamp arrays can include 3, 4, 5, 7, or more zones. Although illustrated with a particular number of heat lamps in first zone of heat lamps 402 and second zone of heat lamps 404, any suitable number of heat lamps can be used in respective zones. Further, the first zone of one or more heat lamps 402 and a second zone of one or more heat lamps 404 can comprise the heat lamps described as heat lamps 120 disclosed herein.

By way of examples, first zone of heat lamps 402 can include a one or more linear heat lamps above substrate support 304 or reaction chamber 302 and/or below substrate support 304 or reaction chamber 302. The linear heat lamps can be, for example, silicon-controlled rectifier (SCR) linear lamps. Each linear lamp can exhibit, for example, about 10,000 W maximum output. Additionally or alternatively, second zone of heat lamps 404 can include one or more linear lamps above substrate support 204 or reaction chambers 202 and 302 and/or below substrate support 204 or reaction chambers 202 and 302. In addition, one or more of the first zone of heat lamps 402 or the second zone of heat lamps 404 can include one or more spot lamps 406-412 above and/or below substrate support 204 or reaction chambers 202 and 302. The spot lamps can each be formed of, for example, four individual round spots and can be located, for example, below substrate support 204 and reaction chambers 202 and 302. The maximum capacity of each (e.g., round) spot lamp can be about 1000-2000 W.

In the illustrated example shown in FIG. 4, heat lamp array 400 includes heat lamps 1-11 above substrate support 204 or reaction chambers 202 and 302, and heat lamps 12-23 and spot lamps 406-412 below substrate support 304 (e.g., corresponding to spot lamps 216 and 316) or reaction chambers 202 and 302. Various configurations and numbers of heat lamps are contemplated, and the heat lamps can comprise linear heat lamps. For example, first zone of one or more heat lamps 402 can include 2 to 12 or 2 to 8 or 2 to 4 (e.g., linear) first zone heat lamps above and/or below substrate support 204 or reaction chambers 202 and 302 (for a total of 2 to 24 or 2 to 16 or 2 to 8 linear heat lamps). Additionally, or alternatively, second zone of one or more heat lamps 404 can include 2 to 12 or 2 to 8 or 2 to 4 (e.g., linear) second zone heat lamps—above or below substrate support 204 and/or reaction chamber 302 (for a total of 2 to 24 or 2 to 16 or 2 to 8 heat lamps). Further, one or more of the first zone of heat lamps 402 and second zone of heat lamps 404 can optionally be 1 to 10 or 2 to 6 or about 4 spot lamps above and/or below substrate support 204 or reaction chambers 202 and 302. The specific example illustrated in FIG. 4 includes first zone of one or more heat lamps 402 including 7 first zone heat lamps (heat lamps 3-9) above reaction chambers 202 and 302, 8 first zone heat lamps (heat lamps 14-21) below reaction chambers 202 and 302 and four first zone spot lamps 406-412 below reaction chambers 202 and 302. Second zone of one or more heat lamps 404 includes four (e.g., linear) second zone heat lamps (heat lamps 1, 2, 10, and 11) above reaction chambers 202 and 302 and four (e.g., linear) second zone heat lamps (heat lamps 12, 13, 22, and 23) below reaction chambers 202 and 302.

In accordance with examples of the disclosure, heat lamps (e.g., heat lamps 3-9 and 14-21) of first zone of heat lamps 402 are located inward of heat lamps (e.g., heat lamps 1, 2, 10,-13, 22, and 23) of second zone of heat lamps 404. Other configurations are also contemplated. For example, heat lamps of second zone of heat lamps 404 can be located inward of heat lamps of first zone of heat lamps 402. Alternatively, heat lamps of first zone of heat lamps 402 and heat lamps of first zone of heat lamps 402 can alternate or be grouped in other configurations.

Referring again to FIGS. 2 and 3, controller 102 can be configured to provide independent control to one or more of the zones of heat lamps (e.g., zones of heat lamps 402 and 404) and/or one or more heat lamps within each zone of heat lamps (e.g., heat lamps 1-23). A power offset can be used to provide different power levels to various heat lamps within a zone of heat lamps to obtain a desired temperature profile and/or to account for varying efficiencies of one or more heat lamps within the zone of heat lamps.

By way of example, controller 102 can be configured to generate signals (e.g., proportional power outputs) for independently controlling first zone of heat lamps 402 based on sensed temperatures at a first substrate or susceptor location 218 and 318 and for independently controlling second zone of heat lamps 404 based on sensed temperatures at a second substrate or susceptor location 220 and 320. To this end, the temperature information or pyrometer temperature outputs, are communicated to controller 102 for processing and, in response, controller 102 generates (e.g., corresponding power ratio) outputs to heat lamps 1-23 or to zones of heat lamps 402 and 404. These (e.g., power ratio) outputs from controller 102 can be assigned individually to each heat lamp or to each heat lamp within a zone depending on the desired control profile determined by the sensed temperatures within the reaction system.

Although all the heat lamps may be operated for the same amount of time and accrue the same total operating hours, certain heat lamps may age faster than others due to, for example, a power ratio output assigned to each heat lamp for processes occurring in the reaction chamber. Monitoring the heat lamps individually allows for identification of faster aging heat lamps, thus facilitating heat lamp replacements and/or heat lamp position swaps, such as moving a heat lamp from a high-power ratio output position to a low power ratio output position once the monitoring data shows that the heat lamp is beginning to fail. This allows one to get away from a time-based total lamp array replacement strategy, and instead replace or reposition lamps when based on lifetime predictions provided software.

Figure 5:
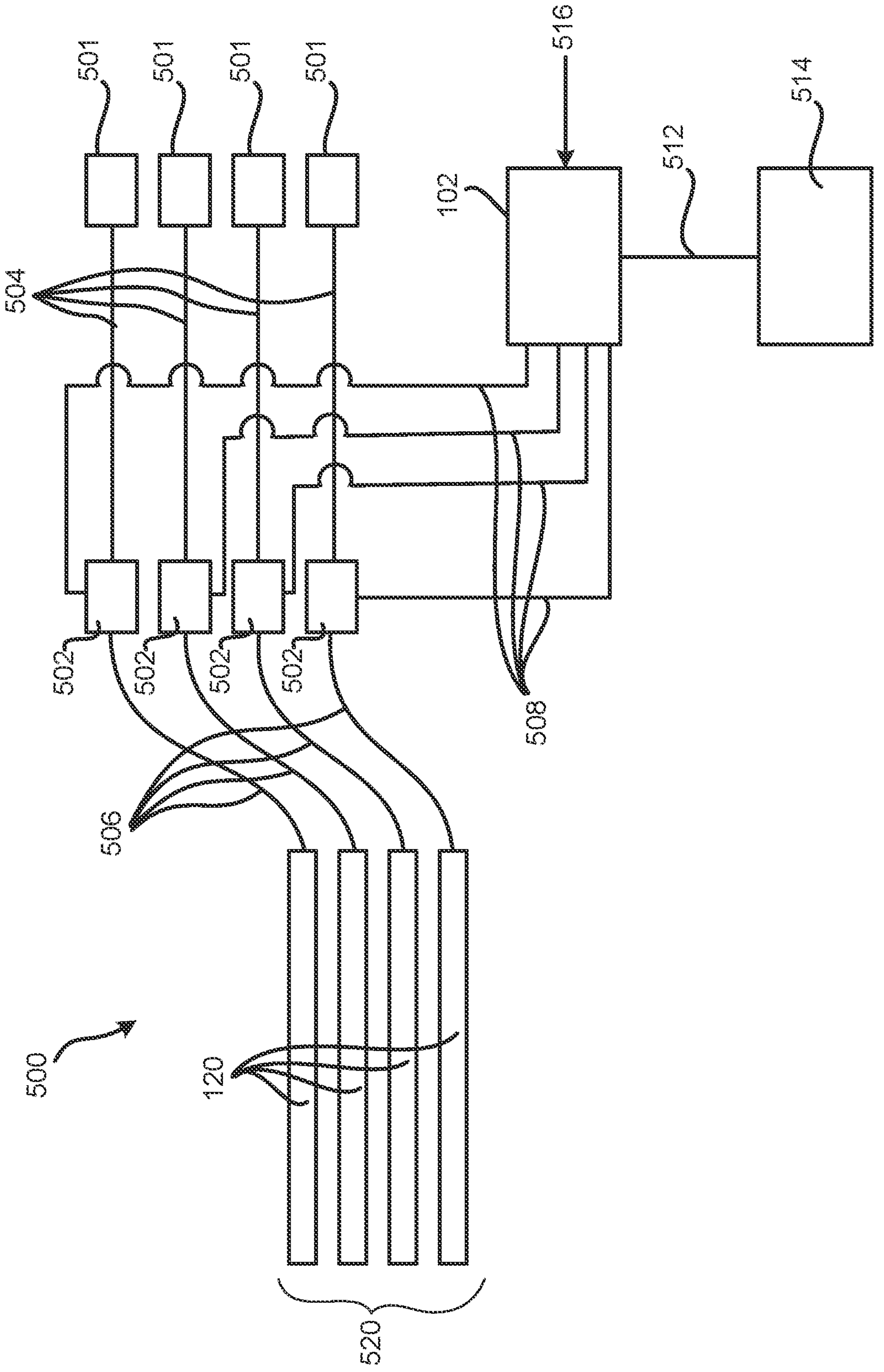
FIG. 5 is a schematic diagram of a heat lamp system in accordance with additional exemplary embodiments of the disclosure.

FIG. 5 is a diagram illustrating another system 500. System 500 includes a number of heat lamps 120 in a heat lamp array 520 used in the semiconductor fabrication process and disposed in a reactor system. The heat lamp array 520 can be used as heat lamp arrays 225, 325, and/or 400. In an example embodiment, the heat lamps 120 receive electrical power from an electrical power source 116 as described above. In the example illustrated, each heat lamp 120 receives electrical power from a respective separate electrical power source 501 which can form part of power source 116. Each power source 501 can be configured to provide a ratio of power to individual heat lamps 120 and/or to zones of heat lamps 120. In an example, a sensor 502 is interposed between each heat lamp 120 and a respective electrical power source 501, and each sensor 502 is configured to receive electrical power from a respective electrical power source 501 by a suitable electrical conductor, wire, or cable 504. The electrical power received by each sensor 502 is passed to a respective heat lamp 120 by a suitable electrical conductor, wire, or cable 506. Alternatively, the sensors 502 may be configured to connect directly to a conductive terminal of the heat lamp, thereby avoiding the use of wires or cables. In an example, the sensors 502 are configured to transfer or pass through the electrical power received from the electrical power source to the heat lamps without changing the amount of electrical power. In an example, the sensors are configured to measure the amount of electrical current or current flow associated with a respective heat lamp.

In an example, the heat lamp is a direct current (DC) device and the electrical power source or power sources 501 are configured to provide DC power to each heat lamp 120. In such example, each power source 501 may be provided in the form of rectifiers such as silicon control rectifiers (SCR) or the like. In an example, the electrical current flow of each heat lamp 120 as determined by a respective sensor 502 (which may form part of an SCR) is transferred by suitable electrical conductor, wire, or cable 508 to a controller (such as controller 102). Alternatively, the current information as measured by each sensor 502 may be transferred from each sensor 502 to the controller 102 wirelessly through the use of wireless transmitters and receivers. The power provided and measured can be used to obtain a resistance value for each heat lamp which can be recorded and stored in the controller 102.

Figure 6:
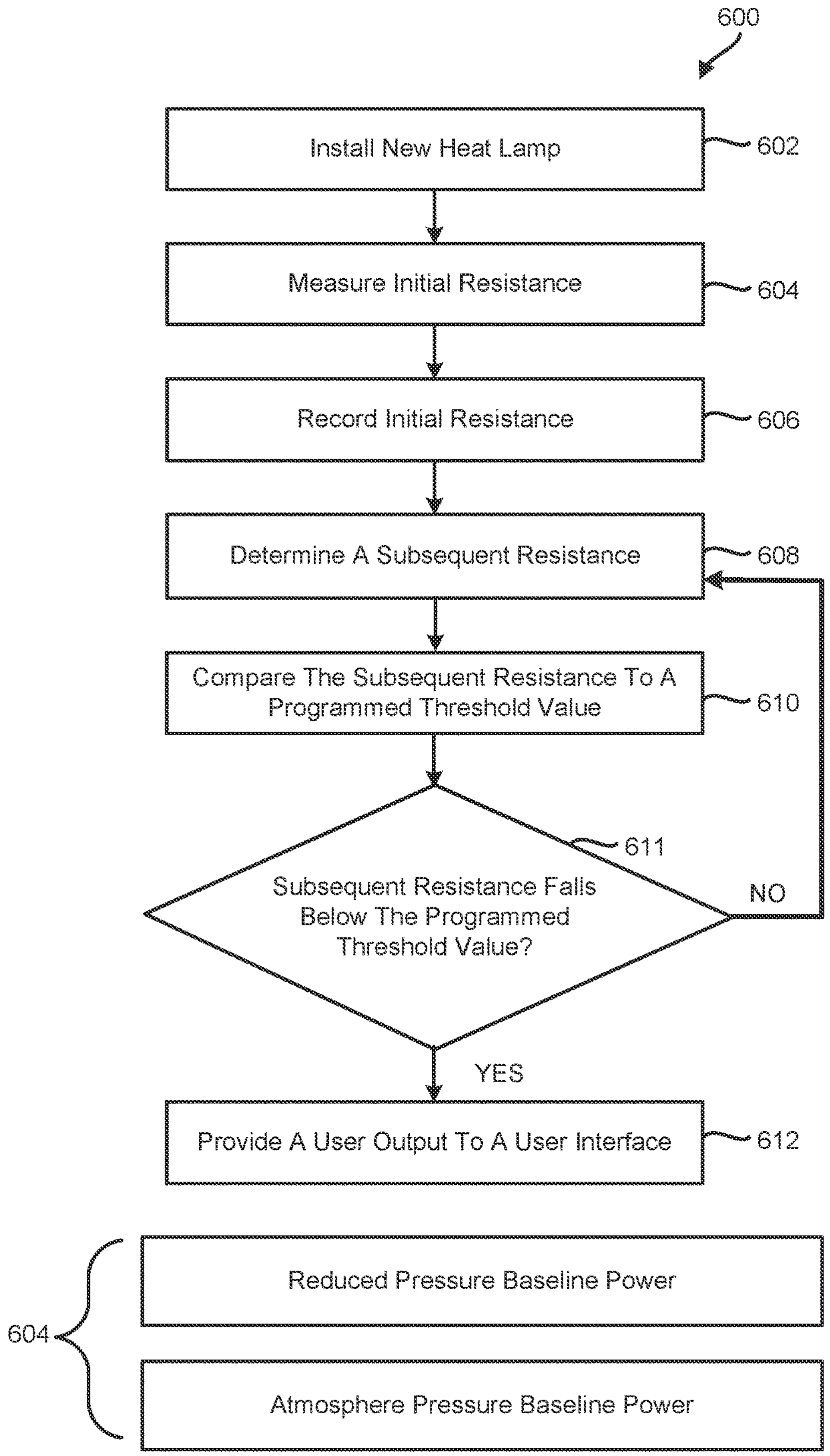
FIG. 6 is a diagram of a method of monitoring a health of a heat lamp system in accordance with exemplary embodiments of the disclosure.

FIG. 6 illustrates an exemplary method 600 for determining the health or status of each heat lamp in a reactor system according to an embodiment of the present disclosure. FIGS. 1-5 illustrate heat lamp systems and reactor systems suitable for use in conjunction with method 600. Method 600 can be used on both reduced pressure and atmospheric epitaxial reaction chambers, such as those reaction chambers disclosed herein. In particular, method 600 can be advantageous for atmospheric reaction chambers which utilize high temperature, thick material layer deposition methods due to the high-power output applied to the heat lamps for extended periods of time.

Method 600 can begin with step 602, which can involve installing a heat lamp (such as heat lamp 120) within a reactor system, such as reactor systems 200 or 300.

During step 604, in an example, the controller 102 is configured and/or programmed to include or measure the known amount of electrical power that is directed to each heat lamp and to determine, from the known amount of electrical power and the measured electrical current flow of heat lamp (provided by each sensor), an initial resistance of each individual heat lamp 120. In an example, the controller is programmed to determine the resistance of each individual heat lamp by using the mathematical equation $P=I^2R$, where "P" equals the electrical power (Watts), "I" equals the electrical current (Amps), and "R" is the resistance (Ohms). The power can be the power provided to a heat lamp to obtain a desired temperature as measured and controlled using one or more pyrometers, 208, 210, 308 and 310. Configured in this manner, the controller 102 is programmed to determine the resistance associated with each individual heat lamp.

Figure 7:
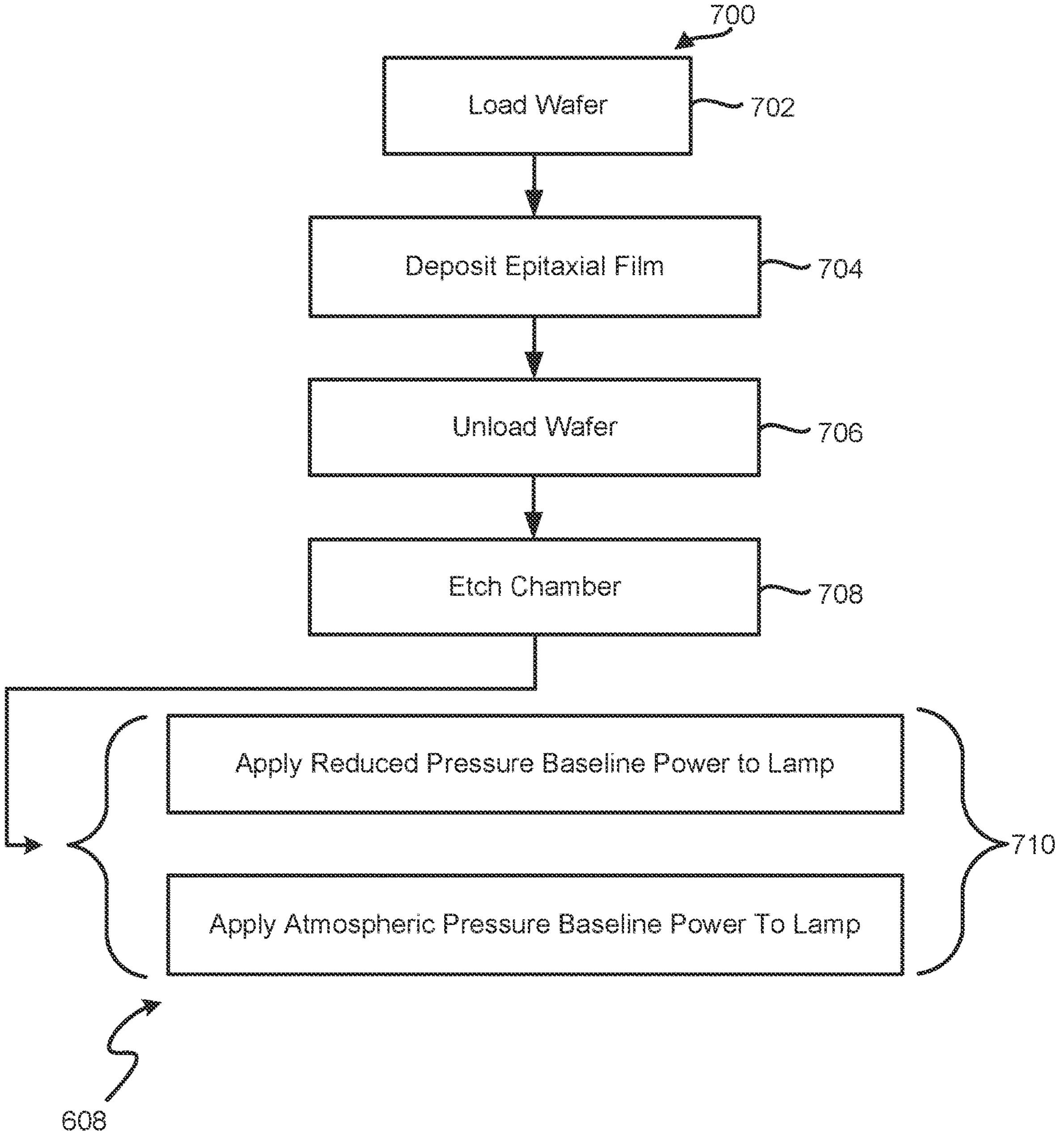
FIG. 7 is a diagram of a method of monitoring a health of a heat lamp system in accordance with exemplary embodiments of the disclosure.

Step 604, which can involve measuring an initial or reference resistance value of the heat lamp (such as heat lamp 120), i.e., when the heat lamp is in a new condition. In an example, the reference resistance of a new heat lamp is determined when the heat lamp is placed into its position relative to a reactor system such as a reactor system illustrated in FIGS. 3 and 4, and the resistance is measured using the process described above. Referring to FIG. 7, step 604 can base the measured initial resistance off of either a reduced pressure baseline power or an atmosphere pressure baseline power based on which reactor system is being used.

Method 600 can also include a step 606, which involves recording the measured initial resistance value. Once the heat lamps initial resistance value is measured, then the measured initial resistance value is stored in a memory 112 of the controller 102 or otherwise logged.

In further examples, method 600 comprises a step 608, which involves determining a subsequent resistance value for each heat lamp. The controller 102 is configured to determine subsequent resistance values of each heat lamp after subsequent uses during subsequent semiconductor fabrication processes. The resistance can be measured at the beginning or end of each process and/or can be measured at periodic intervals and/or before and/or after a process.

In an example, for purposes of determining the subsequent resistance value of each heat lamp at a known or consistent operating or heating state during the semiconductor fabrication process (i.e., for purposes of consistency), the controller is programmed by the user or the like (e.g., using a GUI as described herein) to determine the heat lamp resistance at the same or similar determined operating or heating state during each subsequent semiconductor fabrication process. The particular state of operation that is determined for such heat lamp resistance determination may vary depending on a number of factors such as the user of the semiconductor fabrication process, the particular type of semiconductor fabrication process and the different operating states of the same, and/or the type(s) of heat lamps or other lamps to be measured that are used.

In an example, FIG. 7 illustrates a method 700 for determining a state of operation for the reactor system to determine a subsequent heat lamp resistance. Method 700 includes the steps of loading a wafer into the reaction chamber (step 702), depositing an epitaxial film on the wafer (step 704), unloading the wafer from the reaction chamber (step 706), and finally etching the reaction chamber (step 708) prior to applying a reduced pressure baseline power or an atmosphere pressure baseline power (step 710). It can be advantageous to determine a subsequent heat lamp resistance under step 608 when the reactor is not too busy, such as during a cleaning or etching of the reactor, e.g., after a deposition process. In an example, depending on the particular names given to the different operating cycles, the desired consistent operating cycle for heat lamp resistance determination may be during what may be referred to as a "pre-idle recipe." While the particular operating cycle selected for determining heat lamp resistance may vary, it is to be understood that a feature of such cycle that is selected is that it is the same for each subsequent heat lamp resistance determination for purposes of providing a consistent heat lamp use condition each time so that each subsequent heat lamp resistance determination occurs under the same use conditions.

In an example, the controller 102 may be configured or programmed to determine the resistance value for the individual heat lamps in the manner noted above after every subsequent semiconductor fabrication process, or may be configured or programmed to determine the subsequent resistance value for the individual heat lamps as based on a user criteria or customer preference, which may not be after every subsequent semiconductor fabrication use, e.g., the controller may be configured or programmed to determine heat lamp resistance after every other use or after every two uses or the like. Accordingly, it is to be understood that the systems and methods as disclosed herein may adapted to meet user or customer criteria.

During step 608, a constant predetermined power can be supplied to each lamp. An average, mean or median resistance for each lamp can be measured and calculated e.g., using sensors such as sensors 502.

Further, method 600 comprises step 610, which compares the measured initial resistance value of each heat lamp, or a value derived therefrom to the subsequent resistance value for each heat lamp.

In an example, a user or controller 102 may determine a programmed threshold heat lamp resistance value. In an example, the programmed threshold heat lamp resistance value may be associated with a certain percentage of the heat lamp remaining heat lamp service life. In an example, where the heat lamp initial resistance value (of a new heat lamp) is associated with 100 percent (or a 100 percent remaining heat lamp service life), the programmed threshold value may be set at 20 percent (or a 20 percent remaining heat lamp service life) so that when the determined subsequent resistance of the heat lamp is associated with less than the programmed threshold value of 20 percent, an indication of such is provided so the heat lamp can be replaced.

By way of particular example, where the heat lamp initial resistance value is measured to be approximately 15 ohms, this may be associated with 100 percent. In such example, the programmed threshold heat lamp resistance value may be approximately 10 ohms, which may be associated with 20 percent of remaining service life. Accordingly, when the subsequent resistance of any heat lamp passes or falls below 10 ohms, the controller provides an indication of the same or that the heat lamp is below 20 percent to thereby trigger an indication to replace the heat lamp. Memory 112 can comprise a table of percent remaining life values an associated resistance values.

Figure 8:
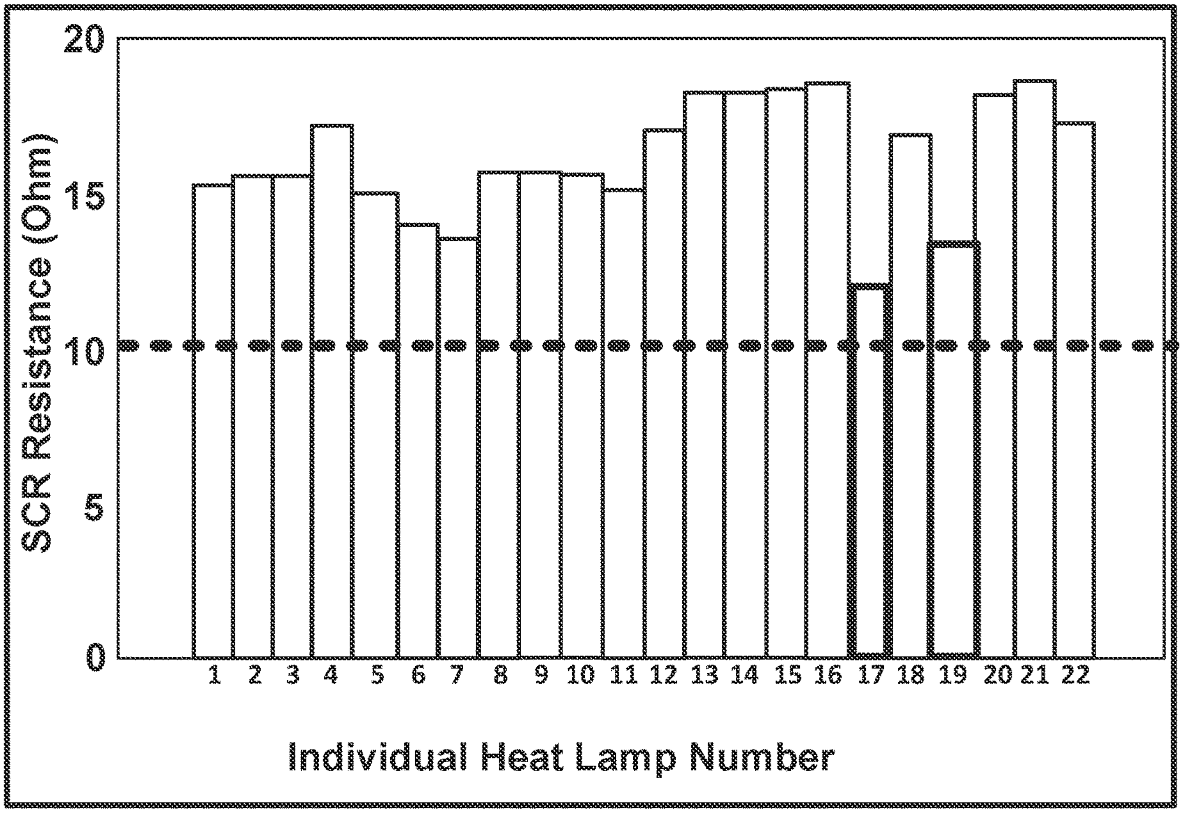
FIG. 8 illustrates a user interface in accordance with exemplary embodiments of the disclosure.

With additional reference to FIG. 8, an exemplary graphical user interface (GUI) is illustrated. In an example the determined heat lamp resistance can be provided on a display in the form of a chart, table, graph, or the like, similar to the data shown in FIG. 8. Each bar in the chart of FIG. 8 corresponds to an individual heat lamp and the y-axis of the chart corresponds to the determined subsequent resistance value of each heat lamp. In this example, once the subsequent resistance value reaches 10 ohms (or other set threshold value), then the system will provide a user output to the user interface (such as user interface 108). Such user output can be an audio or visual alarm, or the like.

Method 600 includes a step 612, which provides the user input to the user interface of the controller, should the subsequent resistance deviate (e.g., fall below) from the initial resistance value by a predetermined amount or fall between the programmed threshold value. If the determined subsequent resistance does not fall below the programmed threshold value, then the method continues back to step 608 to determine a new subsequent resistance value.

Additionally, the user interface can display the heat lamp condition as a percentage of remaining heat lamp service life because that format of information can be more intuitive to a user for purposes of understanding the heat lamp condition and anticipating replacement of the heat lamp. Such percentage of remaining heat lamp service life can be determined using controller 102—e.g., from percent of life and resistance date stored in memory 112.

While a particular method for providing the programmed threshold value has been disclosed, that is based on a specific ohm value, an alternative method may be used where (rather than a specific ohm value being used) the programmed threshold value is based on a difference in resistance between the initial resistance and the subsequent resistance for a heat lamp, i.e., the programmed threshold value is a threshold resistance difference. For example, the programmed threshold value may be provided as a threshold resistance difference of approximately 5 ohms so that heat lamp replacement is indicated by the system when the subsequent resistance value as compared to the initial resistance deviated by (e.g., is reduced by) 5 ohms or more.

In an example, a programmed threshold value is determined and entered, stored or otherwise logged for controller access. The programmed threshold value may vary depending on such factors as the particular type of heat lamp that is being used and/or the particular location of the heat lamp relative to the reactor. In an example, the programmed threshold value is an ohm level that is associated with an operating state or condition of the heat lamp that is known to be approaching an inefficient operating state that is near or nearing an end of effective service life of the heat lamp. In an example, the programmed threshold value may be set to be an ohm level that leaves a margin of remaining effective service life to enable replacement after one or more subsequent semiconductor fabrication process uses. As described herein, during the process of determining the subsequent heat lamp resistance, if the subsequent heat lamp resistance is below the programmed threshold value, then the controller is configured to provide an indication of the same for purposes of signaling the need to replace the heat lamp, e.g., before the next use of the semiconductor fabrication process.

As briefly noted above, with reference to FIGS. 1-5, systems and methods for monitoring the state or condition of heat lamps as disclosed herein comprise the controller 102 that makes use of heat lamp data or information storage or memory, and a program for determining heat lamp resistance and comparing the determined heat lamp resistance to a programmed threshold value as input by a user into or otherwise provided or automatically generated (e.g., by assigning a predetermined percentage of the initial resistance or based on other information).

With reference to FIG. 5, an example, the controller 102 is configured to provide an indication of the state or condition of the individual heat lamps, which the indication may be customized or differently provided depending on user preference or the like. In an example, the controller 102 may be connected by wire 512 or wirelessly to a device 514 for the purpose of displaying, e.g., providing a visual indication of, the status or condition of the heat lamps, and/or for providing an indication of when a determined resistance of the heat lamp has fallen below or exceeded the programmed threshold value, for purposes of thereafter taking action to replace the heat lamp. Additionally or alternatively, the controller 102 may be used with a device 514 that is configured to provide an audible indication or alarm of when a heat lamp has deviated (e.g., fallen below) from the programmed threshold value. Also, it is to be understood that the device 514 useful for providing an indication of the heat lamp condition or state may be located near or remote from the semiconductor fabrication process machinery depending on the particular user preference or situation.

As noted above, in an example the system comprises storage or memory that contains all of the determined heat lamp resistance values for the individual heat lamps. In an example, each determined heat lamp resistance value includes a date and time for condition monitoring or tracking purposes. Additionally, the system may be configured to enable user input 516 for storing certain heat lamp information such as, information about the type of each individual heat lamp, information about the date and time that a new heat lamp was installed, and information about the placement position of the lamp relative to the reactor. These are but a few examples of different types of information that may be input into the system as it relates to the heat lamps, and it to be understood that other types of information that may be useful for tracking and monitoring heat lamp health may also be included and all such other information is intended to be within the scope of heat lamp health monitoring systems as disclosed herein.

In an example, the system 500 may be configured to provide a desired user interface as viewable on a device, such as a device 514, which user display may be customized depending on desired user preferences or the like. In an example, the system 500 may provide a display menu enabling the user to select different display formats or pages such as graphic display, chart display, or the like showing the determined resistance value or effective service life history of each individual lamp, or the most recently determined resistance value or effective service life of the individual lamps. These are but a few examples of heat lamp health display formats that may be provided in accordance with the system and step 612 as disclosed herein, and it is to be understood that display formats other than those specifically disclosed are intended to be within the scope of heat lamp health monitoring system as disclosed herein. In an example, the device may be in the form of a touchscreen display or the like to thereby facilitate user input or interaction with the heat lamp information menu.

Although but a few example embodiments systems and methods for monitoring the health or condition of lamps as used in semiconductor fabrication processing have been disclosed in detail above, those skilled in the art will readily appreciate that many modifications are possible in the example embodiments without materially departing from the intent and purpose of the example systems and method as disclosed herein. For example, as noted above, systems and methods as disclosed herein may be used to monitor the health or condition of not only heat lamps but other lamps used during semiconductor fabrication processing. Also, while the systems and methods described particular methods or approaches for providing a visual or audible indication to a user of when it was determined that a lamp needed to be replaced, systems and methods as disclosed herein may be configured to provide such indications by other techniques such as by using wireless or cellular communication devices or the like to provide a text message alert or other type of signal to a user. Accordingly, all such modifications of systems and methods for monitoring the health or condition of lamps are intended to be included within the scope of this disclosure as defined in the following claims.

What is claimed is:

1. A system for determining a condition of a heat lamp used in a semiconductor fabrication process comprising:
- a reaction chamber comprising a susceptor disposed within the reaction chamber;
- the heat lamp disposed outside of the reaction chamber and optically coupled to the susceptor by a wall of the reaction chamber; and
- a controller for determining a subsequent resistance value of the heat lamp once placed into use in the semiconductor fabrication process, wherein the controller compares the subsequent resistance value to a programmed threshold value, and wherein the controller provides an indication when the subsequent resistance value passes the programmed threshold value, wherein the programmed threshold value is an absolute resistance value of approximately 8 ohms to 12 ohms that equates to a remaining heat lamp service life of approximately 20 percent.

2. The system of claim 1 further comprising a sensor that determines an electrical current of the heat lamp during use.

3. The system of claim 2, wherein the controller determines the subsequent resistance value of the heat lamp from the electrical current as determined by the sensor and an amount of electrical power used to power the heat lamp.

4. The system of claim 1, wherein the controller determines the subsequent resistance value of the heat lamp after repeated uses of the heat lamp during subsequent semiconductor fabrication processes.

5. The system of claim 4, wherein the controller determines the subsequent resistance value of the heat lamp during a same stage of the semiconductor fabrication process.

6. The system of claim 1, wherein the indication is provided to a user interface.

7. The system of claim 1 further comprising one or more additional heat lamps, wherein the controller is configured to determine a subsequent resistance value of each of the one or more additional heat lamps and provide an indication when the subsequent resistance value of each of the heat lamp and the one or more additional heat lamps passes a programmed threshold value of that heat lamp.

8. A system for monitoring a condition of heat lamps used in semiconductor processing comprising:
- a reaction chamber comprising a susceptor disposed within the reaction chamber;

more than one heat lamp disposed outside of the reaction chamber and optically coupled to the susceptor by a wall of the reaction chamber;

sensors configured to measure an electrical current flow of each of the heat lamps; and a controller for determining a subsequent resistance value of each of the heat lamps after being placed into semiconductor processing use, wherein the controller determines whether the subsequent resistance value of each heat lamp deviates from a programmed threshold value of each of the heat lamps by a predetermined amount, and wherein the controller provides an indication when the subsequent resistance value of any of the heat lamps falls below the programmed threshold value by the predetermined amount, wherein the programmed threshold value is an absolute resistance value of approximately 10 ohms that equates to a remaining heat lamp service life of approximately 20 percent.

9. The system of claim 8, wherein the controller is configured to determine the subsequent resistance value of the heat lamps during a same stage of semiconductor processing.

10. The system of claim 8, wherein the controller is configured to determine the subsequent resistance value for each of the heat lamps from the electrical current flow of the respective heat lamp as measured by a respective sensor of the sensors and an amount of electrical power directed to the respective heat lamp.

11. The system of claim 8, wherein an initial resistance value of each of the heat lamps determined when the respective heat lamp is new equates to a service life of approximately 100 percent.

12. A method of monitoring a condition of a heat lamp used in a semiconductor fabrication process comprising a reaction chamber, a susceptor disposed in the reaction chamber, the heat lamp disposed outside the reaction chamber and optically coupled to the susceptor by a wall of the reaction chamber, the method comprising:

determining a subsequent resistance value of the heat lamp after being used in the semiconductor fabrication process;

comparing the subsequent resistance value of the heat lamp to a programmed threshold value, wherein the programmed threshold value is an absolute resistance value that equates to a remaining heat lamp service life of approximately 20 percent; and providing an indication when the subsequent resistance value falls below the programmed threshold value.

13. The method of claim 12, further comprising measuring an initial resistance value of the heat lamp when the heat lamp is in a new condition, and wherein the programmed threshold value is the absolute resistance value that is less than the initial resistance value.

14. The method of claim 12, wherein the step of determining is performed without removing the heat lamp from a reactor system including the reaction chamber.

15. The method of claim 12, wherein during the step of determining, a sensor is used to determine a current flow to the heat lamp and a controller is used to determine the subsequent resistance value from the current flow provided by the sensor and an amount of electrical power directed to the heat lamp.

16. The method of claim 13, wherein the step of determining is performed during a predetermined stage of the semiconductor fabrication process.

17. The method of claim 16, wherein the steps of determining and comparing are repeated during subsequent uses of the semiconductor fabrication process.

18. The method of claim 12, wherein during the step of providing the indication is provided to a user interface in the form of one or more of a visual display or audible sound.

* * * * *